United States Patent
Cingoz et al.

(10) Patent No.: US 11,619,861 B1
(45) Date of Patent: Apr. 4, 2023

(54) SINGLE SIDEBAND LASER SYSTEM FOR ATOMIC DEVICES

(71) Applicant: Vector Atomic, Inc., Pleasanton, CA (US)

(72) Inventors: Arman Cingoz, Pleasanton, CA (US); Martin M. Boyd, Pleasanton, CA (US); Matthew T. Cashen, Pleasanton, CA (US)

(73) Assignee: Vector Atomic, Inc., Pleasanton, CA (US)

( * ) Notice: Subject to any disclaimer, the term of this patent is extended or adjusted under 35 U.S.C. 154(b) by 395 days.

(21) Appl. No.: 17/028,057

(22) Filed: Sep. 22, 2020

(51) Int. Cl.
*G02F 1/377* (2006.01)
*H01S 3/13* (2006.01)
(Continued)

(52) U.S. Cl.
CPC .......... *G02F 1/377* (2013.01); *G02B 6/12007* (2013.01); *G02F 1/3551* (2013.01);
(Continued)

(58) Field of Classification Search
CPC ............. H01S 3/06708; H01S 3/06754; H01S 3/1305; H01S 3/1608; H01S 5/0687; H01S 5/12; H01S 5/14; G02F 1/3551; G02F 1/3558; G02F 1/377; G02F 2202/20; G02F 2203/11; G02F 2203/48; G02F 2203/50; G02B 6/12007
See application file for complete search history.

(56) References Cited

U.S. PATENT DOCUMENTS 6,845,108 B1 * 1/2005 Liu ................ H01S 3/1109
372/20
7,180,657 B1 * 2/2007 Shevy ............ H01S 3/1303
385/125
(Continued)

FOREIGN PATENT DOCUMENTS

CN 106471685 A * 3/2017 ............. H03B 17/00

OTHER PUBLICATIONS

Caldani et al., "A prototype industrial laser system for cold atom inertial sensing in space", arXiv:1908.10058v1 [astro-ph.IM] Aug. 27, 2019, pp. 1-9.
(Continued)

*Primary Examiner* — Daniel Petkovsek
(74) *Attorney, Agent, or Firm* — Clements Bernard Walker; Christopher L. Bernard

(57) ABSTRACT

Disclosed embodiments include laser systems. An illustrative laser system includes a tunable laser. A beam splitter is operatively couplable to an output of the laser and is configured to split light output from the laser into a first path and a second path. A first modulator is disposed in the first path and is configured to generate first set of sidebands. A bandpass filter circuit includes a fiber Bragg grating filter and is operatively couplable to receive output from the first modulator and to pass a selected sideband of the first set of sidebands. A lock circuit is disposed in the second path, is configured to determine and stabilize wavelength of the laser, and is further configured to cooperate with the fiber Bragg grating filter to maintain a static lock point for the laser while allowing output of the first path to be tunable with respect to the lock point.

26 Claims, 6 Drawing Sheets

(51) Int. Cl.
    *H01S 5/12*     (2021.01)
    *H01S 5/14*     (2006.01)
    *G02B 6/12*     (2006.01)
    *G02F 1/355*     (2006.01)
    *H01S 5/0687*     (2006.01)

(52) U.S. Cl.
    CPC .......... *G02F 1/3558* (2013.01); *H01S 3/1305* (2013.01); *H01S 5/0687* (2013.01); *H01S 5/12* (2013.01); *H01S 5/14* (2013.01); *G02F 2202/20* (2013.01); *G02F 2203/11* (2013.01); *G02F 2203/48* (2013.01); *G02F 2203/50* (2013.01)

(56) References Cited

U.S. PATENT DOCUMENTS

| | | | | |
|---|---|---|---|---|
| 7,848,370 | B2* | 12/2010 | Kewitsch | ................ H01S 5/042 372/50.21 |
| 10,288,428 | B1* | 5/2019 | Cingoz | ................ G01P 15/093 |
| 10,340,658 | B1 | 7/2019 | Boyd et al. | |

OTHER PUBLICATIONS

Battelier et al., "Development of compact cold-atom sensors for inertial navigation", SPIEDigitalLibrary.org/conference-proceedings-of-spie, Proc.of SPIE vol. 9900 990004-1, Apr. 29, 2016, pp. 1-18.

Carraz et al., "Phase shift in an atom interferometer induced by the additional laser lines of a Raman laser generated by modulation", arXiv:1205.0690v1 [physics.atom-ph] May 3, 2012, pp. 1-8.

Rammeloo et al., "Performance of an optical single-sideband laser system for atom interferometry", arXiv:2004.11645v1 [physics.atom-ph] Apr. 24, 2020, pp. 1-16.

Zhu et al., "Application of optical single-sideband laser in Raman atom interferometry", Research Article, vol. 26, No. 6, Mar. 19, 2018, Optics Express 6542, pp. 1-12.

* cited by examiner

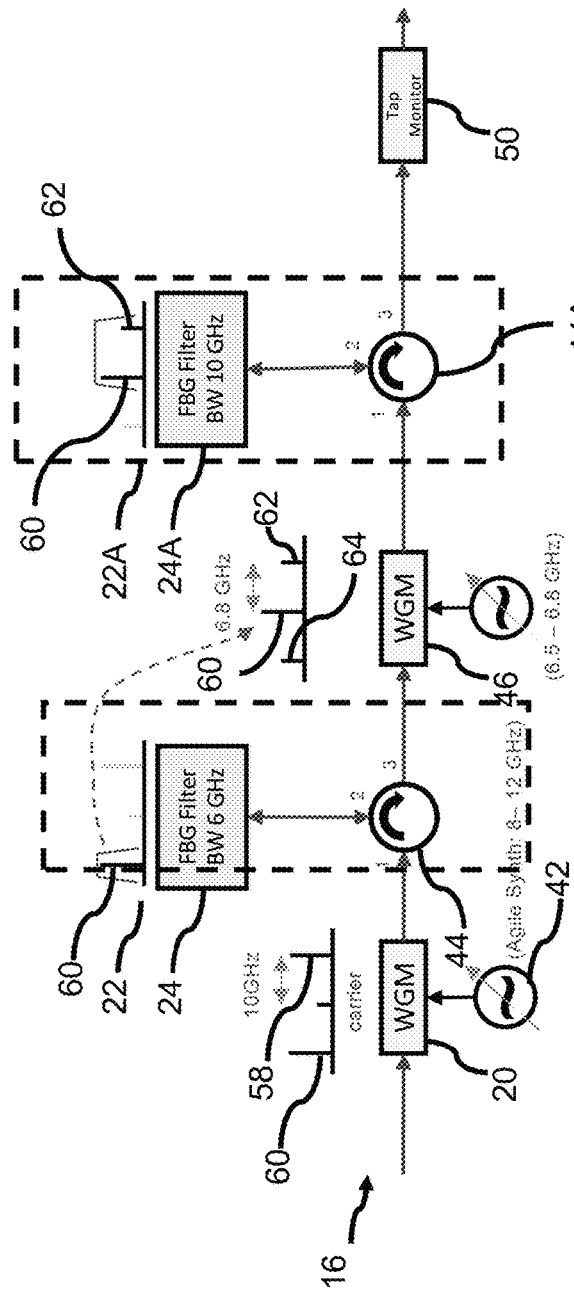
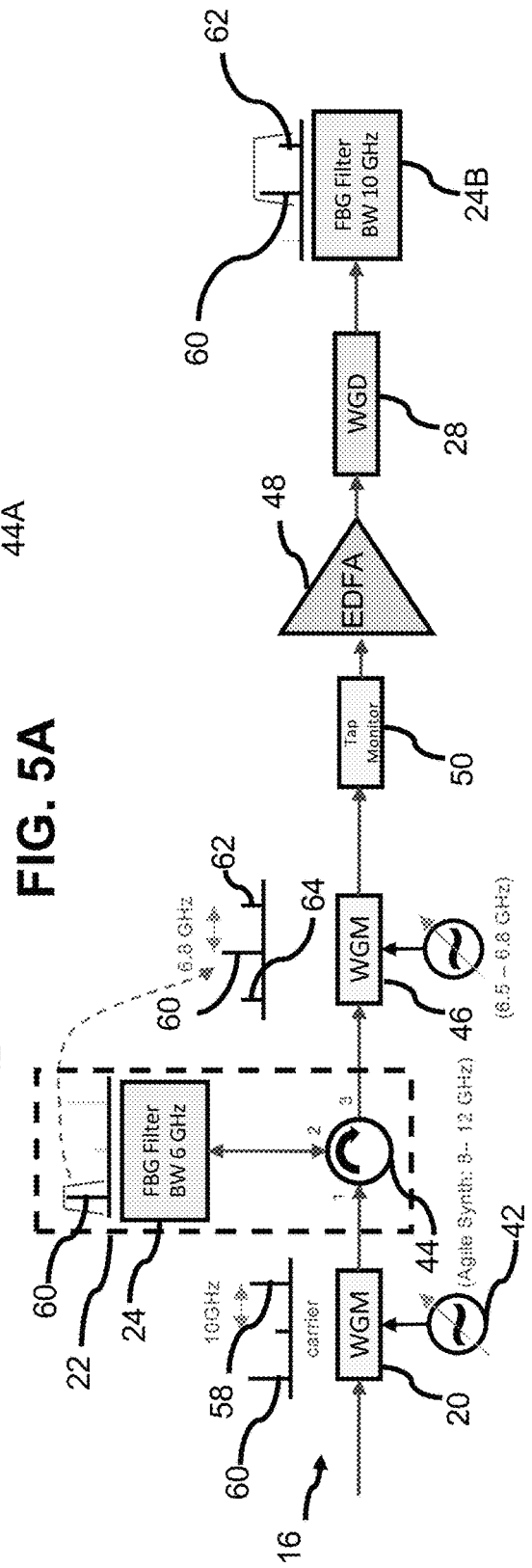
FIG. 5A
FIG. 5B

SINGLE SIDEBAND LASER SYSTEM FOR ATOMIC DEVICES

TECHNICAL FIELD

The present disclosure relates to laser systems.

BACKGROUND

A variety of laser-cooled atomic species are used in academic and industrial settings to realize various atomic physics experiments and commercial sensors, such as without limitation atomic gyroscopes, gravimeters, gravity gradiometers, magnetometers, atomic-, molecular-, and ion-based sensors, clocks, quantum computing devices, and the like. In such devices, laser systems are used to precisely prepare, probe, and read-out atomic states as part of the measurement process.

Such devices typically impose stringent specifications on laser system capabilities and performance. For example, a laser system may be required to lock to an absolute wavelength reference (such as, for example, a rubidium cell). As another example, a laser system may be required to output several (slightly) different wavelengths over a measurement sequence. In some applications, outputting different wavelengths may be accomplished by use of multiple lasers and components. Use of multiple lasers and components can increase component count and overall system size, weight, and power, and cost ("SWaP-C"), which can detract from suitability for fieldable devices.

Moreover, regardless of the application, laser trapping, cooling, state preparation, and readout sequences entail use of a laser source with sub-MHz linewidth and that can be tuned arbitrarily with GHz-level frequency agility that can settle to desired frequencies deterministically within <100 μs. The frequency agility is especially important for high-repetition rate systems with short measurement cycles, such as sensors and clocks for applications in mobile platforms where the system has to cope with platform motion and vibrations by operating on a timescale that is fast compared with the platform's dynamics. Other factors include environmental robustness, lifetime, and autonomous operation of the laser system that are critical for real-world applications, where sensors must operate in uncontrolled temperature and humidity environments and are unattended for months at a time.

Relevant atomic transitions typically lie in the wavelength range from 400-800 nm. While direct semiconductor-based laser systems are available in many cases and can provide a small size and power footprint, the underlying components are "research-grade" and, thus, lack the robustness to operate in the field for extended durations. Semiconductor seed lasers and optical amplifiers for atomic transitions typically have lifetimes <10,000 hours and inconsistent performance batch-to-batch. Moreover, aging can lead to "mode hops" where the output frequency of the laser has a discrete and unrecoverable frequency jump to an adjacent longitudinal lasing mode at a given temperature and current. Diagnosing issues caused by mode hops in the field without laboratory test equipment is very challenging and is a significant concern for autonomous operation. Similarly, opto-electronics entailed for agile laser frequency control, such as waveguide modulators, can suffer from photorefractive damage that limits power handling and operational lifetime.

SUMMARY

Various disclosed embodiments include laser systems, such as single sideband laser systems for atomic devices.

In various embodiments, an illustrative laser system includes a tunable laser. A beam splitter is operatively couplable to an output of the laser and is configured to split light output from the laser into a first path and a second path. A first modulator is disposed in the first path and is configured to generate first set of sidebands. A bandpass filter circuit is operatively couplable to receive output from the first modulator and to pass a selected sideband of the first set of sidebands therethrough. The bandpass filter circuit includes a fiber Bragg grating filter. A lock circuit is disposed in the second path, and the lock circuit is configured to determine and stabilize wavelength of the laser. The lock circuit is further configured to cooperate with the fiber Bragg grating filter to maintain a static lock point for the laser while allowing output of the first path to be tunable with respect to the lock point.

In other embodiments, another laser system includes a tunable laser. A beam splitter is operatively couplable to an output of the laser and is configured to split light output from the laser into a first path and a second path. A first modulator is disposed in the first path and is configured to generate a first set of sidebands. A bandpass filter circuit is operatively couplable to receive output from the first modulator and to pass a selected sideband of the first set of sidebands therethrough. The bandpass filter circuit includes a fiber Bragg grating filter. A lock circuit is disposed in the second path, and the lock circuit is configured to determine and stabilize wavelength of the laser. A second modulator is operatively coupled to receive light output from the bandpass filter circuit and to generate a second set of sidebands. An optical frequency doubler is configured to double frequency of light in the first path. The lock circuit is further configured to cooperate with the fiber Bragg grating filter to maintain a static lock point for the laser while allowing output of the first path to be tunable with respect to the lock point.

In other embodiments, another laser system includes a tunable laser. A beam splitter is operatively couplable to an output of the laser and is configured to split light output from the laser into a first path and a second path. A first modulator is disposed in the first path and is configured to generate a first set of sidebands. A first bandpass filter circuit is operatively couplable to receive output from the first modulator and to pass a selected sideband of the first set of sidebands therethrough. The first bandpass filter circuit includes a first fiber Bragg grating filter. A lock circuit is disposed in the second path, and the lock circuit is configured to determine and stabilize wavelength of the laser. A second modulator is operatively coupled to receive light output from the first bandpass filter circuit and to generate a second set of sidebands. A second bandpass filter circuit is operatively couplable to receive output from the second modulator and to pass a selected sideband of the second set of sidebands therethrough. The second bandpass filter circuit includes a second fiber Bragg grating filter. The lock circuit is further configured to cooperate with the fiber Bragg grating filter to maintain a static lock point for the laser while allowing output of the first path to be tunable with respect to the lock point.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Illustrative embodiments are illustrated in referenced figures of the drawings. It is intended that the embodiments and figures disclosed herein are to be considered illustrative rather than restrictive.

FIGS. 5A and 5B are block diagrams of components in other implementations of a first path of the laser system of FIG. 1.

DETAILED DESCRIPTION

Figure 1:
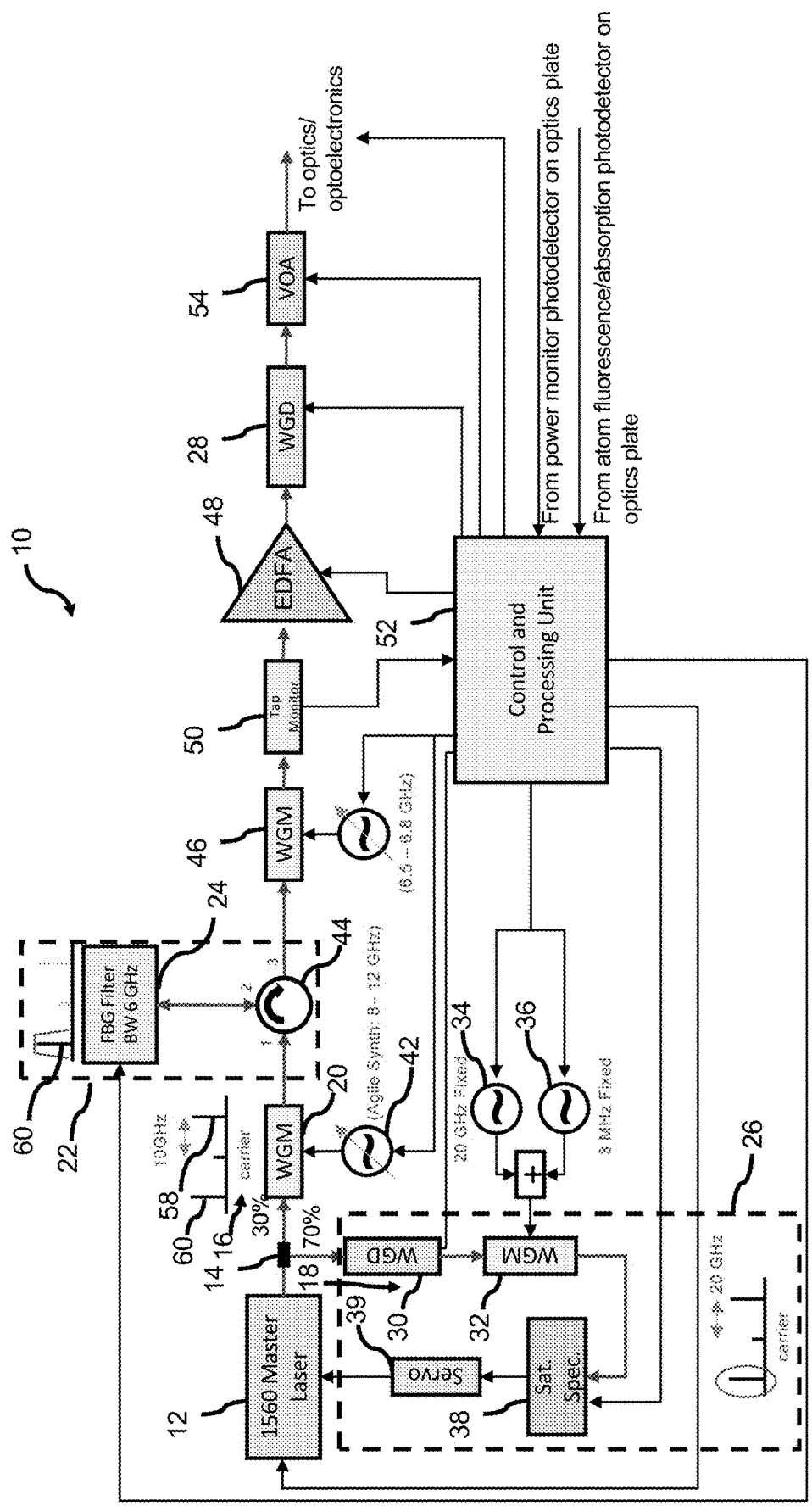
FIG. 1 is a block diagram of an illustrative laser system.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

By way of overview, various disclosed embodiments include laser systems, such as single sideband laser systems for atomic devices.

Still by way of overview and referring to FIG. 1, in various embodiments an illustrative laser system 10 includes a tunable laser 12. A beam splitter 14 is operatively couplable to an output of the laser 12 and is configured to split light output from the laser 12 into a path 16 and a path 18. A modulator 20 is disposed in the path 16 and is configured to generate a first set of sidebands. A bandpass filter circuit 22 is operatively couplable to receive output from the modulator 20 and to pass a selected sideband of the first set of sidebands therethrough. The bandpass filter circuit 22 includes a fiber Bragg grating filter 24. A lock circuit 26 is disposed in the path 18, and the lock circuit 26 is configured to determine and stabilize wavelength of the laser 12. The lock circuit 26 is further configured to cooperate with the fiber Bragg grating filter 24 to maintain a static lock point for the laser 12 while allowing output of the path 16 to be tunable with respect to the lock point. It will be appreciated that such embodiments may help contribute to improving reliability in lock of the laser 12 compared to currently-known laser systems that use dynamic lock points.

Still by way of overview, it will be appreciated that various embodiments can help provide frequency agility while maintaining a static lock point for the laser 12. As will be explained below, such frequency agility while maintaining a static lock point for the laser 12 can be accomplished by use of the narrowband fiber Bragg grating filter 24—which acts as an optical bandpass filter to selectively reflect a single optical sideband out of the preceding modulator 20. In various embodiments, this selected sideband becomes the carrier frequency for subsequent optical amplification and subsequent frequency doubling. Because the frequency of this sideband is defined by the microwave modulation frequency of the modulator 20, it can be changed, tuned, or scanned as fast as a microwave synthesizer (that drives the modulator 20) is capable.

Still by way of overview and still referring to FIG. 1, in some such embodiments an an optical frequency doubler 28 may be configured to double frequency of light in the path 16. In such embodiments, it will be appreciated that components of the laser system 10 may include telecommunications-grade components (such as those for generation, modulation, and filtering) at a lower frequency instead of less robust, research-grade components for direct semiconductor generation at doubled frequencies. In such embodiments, disclosed architectures can be based on lasers, amplifiers, and modulators that have been developed by the telecommunication industry to provide robust and reliable operation with on the order of greater than 100,000 hours mean time between failure. As a non-limiting example, in various embodiments amplified 1560 nm light can be frequency doubled using a frequency doubling crystal to produce a final output at wavelengths such as, for example and without limitation, 780 nm for rubidium isotopes.

Because optical amplification is one of the main power consumption drivers in various embodiments and because frequency doubling crystals are one of the major cost drivers, in various embodiments it may be desirable to reduce the number of independent amplification and frequency doubling paths. To that end, various disclosed embodiments can help provide frequency agility entailed with a single optical amplification path. For example and provided by way of illustration only and not of limitation, an illustrative implementation at rubidium wavelengths has provided greater than 600 mW of optical power in pristine optical mode to downstream 780 nm optics and optoelectronics. Such a non-limiting, illustrative example is based on fiber-coupled components and can be fusion-spliced and integrated onto a single spool tray, if desired.

Now that an overview has been presented, details regarding various embodiments will be provided below via examples set forth by way of illustration only and not of limitation. After illustrative details regarding construction of illustrative embodiments are set forth, operation of various embodiments will be explained.

Still referring to FIG. 1, in various embodiments the laser 12 includes a tunable laser. In various embodiments, the laser 12 may be a master laser or a seed laser. In various embodiments, the laser 12 may include any suitable type of laser as desired, such as a distributed feedback (DFB) laser, an extended cavity diode laser (ECDL), a fiber laser, and the like.

For example and given by way of illustration only and not of limitation, in some embodiments the laser 12 may include a high power (such as up to 100 mW or so) single mode DFB laser suitable for dense wavelength division multiplication (DWDM) networks. In some such embodiments the laser 12 may be packaged in a standard 14-pin butterfly package with in integrated optical isolator and fiber-coupled to polarization-maintaining fiber. To operate at the desired wavelength, in some such embodiments the laser 12 may be specified for Channel 21 of the ITU grid and may provide around 500 kHz linewidth at 1560 nm.

As further examples given by way of illustration only and not of limitation, in some other embodiments the laser 12 may include an ECDL or a fiber laser. It will be appreciated that, in such embodiments, such ECDLs and fiber lasers have much narrower laser linewidths (on the order of less than 10 kHz) that are suitable for high performance sensors but are not as robust or high power as a DFB laser. As a result, embodiments that use such ECDLs and fiber lasers use of may entail use of an additional amplifier.

In various embodiments and given by way of illustration only and not of limitation, the laser 12 may operate at a wavelength of 1560 nm. However, it will be appreciated that the laser 12 may operate at any wavelength (or frequency) as desired for a particular application and no such limitation is intended and should not be inferred. Various embodiments are tailored to wavelengths of 1560/780 nm for use with rubidium atoms. However, it will be appreciated that other atom atoms may be used for the same application—such as, for example and without limitation, cesium atoms at 852 nm. It will also be appreciated that some wavelengths may or may not entail use of frequency doublers. To that end, various embodiments could also be implemented in direct 780 nm laser systems and at other wavelengths. It will be appreciated that such embodiments may entail part reliability issues and part availability issues for devices that operate at a wavelength of 780 nm that may not arise for devices that operate at a wavelength of 1560 nm.

As mentioned above, the beam splitter 14 is operatively couplable to an output of the laser 12 and is configured to split light output from the laser 12 into the path 16 and the path 18. In various embodiments, the beam splitter 14 may include a polarization-maintaining fiber optic splitter with an integrated optical isolator. In various embodiments, the beam splitter 14 is configured to split the light output from the laser 12 with a ratio of thirty percent into the path 16 and seventy percent into the path 18. It will be appreciated that this ratio depends on the particular laser used as the laser 12 and is given as a non-limiting example only.

As also mentioned above, the lock circuit 26 is disposed in the path 18 and is configured to determine and stabilize wavelength of the laser 12. As will be explained further below, the lock circuit 26 is further configured to cooperate with the fiber Bragg grating filter 24 to maintain a static lock point for the laser 12 while allowing for frequency agility in the path 16.

The light in the path 18 is first sent through an optical frequency doubler 30. In various embodiments the optical frequency doubler 30 may include a highly-efficient, ridge-waveguide, periodically-poled lithium niobate (LiNbO3) optical frequency doubling crystal. In embodiments in which the laser 12 operates at a wavelength of 1560 nm, the optical frequency doubler 30 converts the light with a wavelength of 1560 nm to light with a wavelength of 780 nm. It will be appreciated that the amount of input light power and output light power depends on the device used for the frequency doubler 30. However, in various embodiments input light power and output light power can range from around 35-70 mW input that generates around 5 mW optical power at a wavelength of 780 nm. It will be further appreciated that the optical frequency doubler 30 (and the frequency doubler 28) may be a waveguide device or a bulk crystal device as desired for a particular application. In various embodiments waveguide devices may be desirable because they have higher conversion efficiency and can be made of periodically-polled potassium titanyl phosphate (PPKTP) crystals. In other embodiments the optical frequency doubler 30 does not have to be periodically-polled. However, it will be appreciated that phase-matching in non-polled devices entails precise optical coupling angles and can lead to increased sensitivity in terms of optical alignment.

Still referring to FIG. 1, output of the optical frequency doubler 30 is sent through a modulator 32. The modulator 32 adds spatially overlapping frequency components at +/− multiples of the drive frequency (with the most prominent and sidebands of interest being the first order sidebands).

Given by way of example only and not of limitation, in various embodiments the optical frequency doubler 30 may include a 780 nm waveguide electro-optic phase modulator in a LiNbO3 waveguide device. It will be appreciated that the modulator 32 can be made with potassium titanyl phosphate (KTP) instead of LiNbO3—but that any variety of LiNbO3 modulators (such as without limitation titanium-diffused or proton-exchanged) are acceptable. In various embodiments the optical frequency doubler 30 creates optical sidebands at the radio frequency (RF) drive frequency by phase modulating the optical carrier. In various embodiments, the modulator 32 is driven with two RF frequencies simultaneously. In some such embodiments one RF drive 34 operates at 20 GHz with sufficient amplitude to create an optical spectrum in which first-order sidebands have maximized optical power and the carrier is nearly suppressed. It will be appreciated that power level of the RF drive 34 is device-specific but is on the order of around 22-26 dBm for typical devices. In such embodiments another RF drive 36 operates at 3 MHz (but can be anywhere in the 1-10 MHz range) with a typical amplitude of around 15 dBm.

The RF drive 36 creates the frequency modulation entailed in generating an error signal from a rubidium saturation absorption spectrometer 38. The saturation absorption spectrometer 38 is a cell that contains rubidium and is used to lock the laser 12 to a specific transition (wavelength). Output from the saturation absorption spectrometer 38 is provided to a servomechanism 39. The servomechanism 39 is an electronic controller that feeds back to the laser 12 current/temperature to keep the laser 12 locked to transition.

Figure 2:
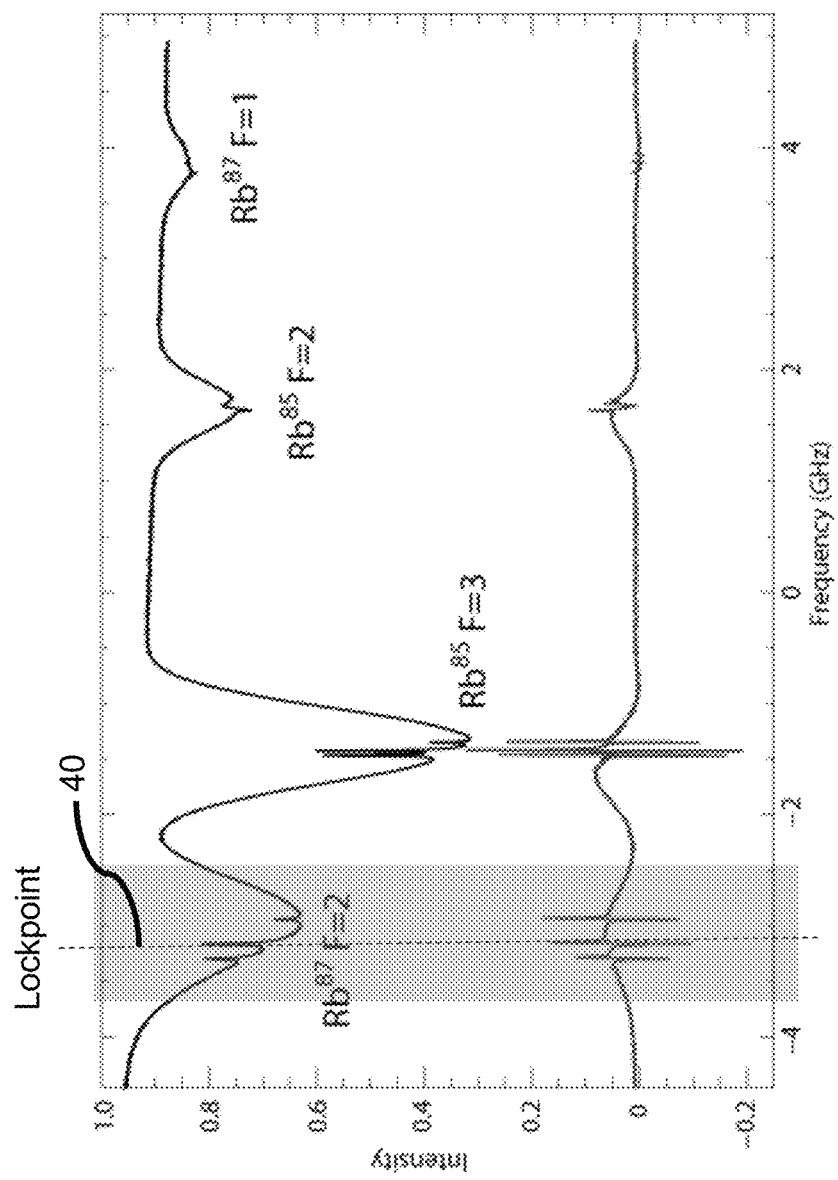
FIG. 2 is a graph of absorption spectrum of rubidium versus frequency.

Referring additionally to FIG. 2, in various embodiments at start-up the laser 12 is nominally tuned to a Fraunhofer D2 line manifold for rubidium. Because the entire absorption features due to $^{87}$Rb and $^{85}$Rb ground states are within an 8 GHz frequency region, the 20 GHz spacing between the sidebands and the carrier lead to three well-resolved rubidium spectra separated by +/−20 GHz if the laser 12 is swept through the absorption features. In various embodiments the laser 12 is locked to the $^{87}$Rb F=2 to F'=2/3 crossover (that is, a dashed line 40) with a first order lower sideband of the laser 12. In various embodiments, this lock point is at the carrier frequency minus 20 GHz. It will be appreciated that this transition is typically chosen because it gives the largest and cleanest error signal to lock to. In principle, any of the absorption features in the $^{87}$Rb or $^{85}$Rb manifold can be used for locking. With this scheme, the 20 GHz lower sideband is locked to the crossover transition with an absolute transition frequency of 384.227982 THz using standard servo techniques that control laser frequency via laser current and temperature. As a result, the 780 nm carrier is 20 GHz up-shifted from resonance, with an absolute frequency of 384.247982 THz. Because the 1560 nm carrier has half the frequency, its absolute frequency is 192.123991 THz—which is 10 GHz up-shifted from the 1560 nm carrier that would be on transition.

Once the laser 12 is locked, its absolute frequency is unchanged—even though the main output path 16 has frequency tunability on the order of magnitude of GHz. The frequency-tunable laser with the static lock is accomplished via a chain of devices in the path 16—and, specifically, the fiber Bragg grating filter 24. The devices in the path 16 will be explained next by way of non-limiting examples.

As mentioned above, the modulator 20 is disposed in the path 16 and is configured to generate a first set of sidebands. Like the modulator 32, the modulator 20 adds spatially overlapping frequency components at +/− multiples of the drive frequency (with the most prominent and sidebands of interest being the first order sidebands). In various embodiments, the modulator 20 may include a waveguide electro-optic device—but at 1560 nm. An RF drive 42 provides the RF frequency that drives the modulator 20. It will be appreciated that the RF drive 42 provides the frequency agility resultant in various disclosed embodiments. In various embodiments, drive frequency of the RF drive 42 is in a range between 8 GHz-12 GHz and nominal drive frequency of the RF drive 42 is around 10 GHz—such that the first-order lower sideband nominally compensates the static detuning created via the lock path. It will be appreciated that, for specific trapping, cooling, state preparation, possible Raman transitions, and detection tasks, drive frequency of the RF drive 42 (and consequently the frequency of the sidebands) is changed.

Given by way of non-limiting example, Table 1 below shows frequencies for an atom interferometer sequence on $^{87}$Rb.

TABLE 1

| Function | 1560 nm modulator frequency |
|---|---|
| Magneto Optical Trap (MOT) | 10312.5 MHz |
| Polarization Gradient Cooling (PGC) | 10312.5 → 10292.5 MHz |
| Optical Pumping/Depumping (OP) | 10123.15 MHz |
| Measurement (Raman Transitions) | 9835 MHz |
| State Detection | 10335 MHz |

It will be appreciated that information in Table 1 assumes a 780 nm modulator frequency at 20.476 GHz and a laser lock to the F=2 to F'=3/2 crossover.

In such embodiments, agility of the system 10 may be limited only by agility of the RF drive 42 that drives the modulator 20 and can be on the order of less than around 100 microseconds with a well-designed voltage-controlled oscillator (VCO) or digital direct synthesis (DDS) system. Regardless, it will be appreciated that the RF drive 42 is adjusted until the carrier is suppressed.

As mentioned above, the bandpass filter circuit 22 is operatively couplable to receive output from the modulator 20 and to pass a selected sideband of the first set of sidebands therethrough, and the bandpass filter circuit 22 includes the fiber Bragg grating filter 24. The fiber Bragg grating filter 24 is a bandpass filter that only passes a narrow range of wavelengths/frequencies. In various embodiments the bandpass filter circuit 22 also includes a fiber optic circulator 44. The fiber optic circulator 44 is a multiple-port optical device wherein light entering any port exits from the next port. In various embodiments the fiber optic circulator 44 and the fiber Bragg grating filter 24 work in tandem to filter the optical spectrum emerging from the modulator 20 such that only the first-order lower sideband (which is at the correct frequency to interact with the rubidium atoms) is passed therethrough.

The output of the modulator 20 is coupled from port 1 of the fiber optic circulator 44 to port 2 of the fiber optic circulator 44, which is connected to the fiber Bragg grating filter 24. The fiber Bragg grating filter 24 reflects optical frequencies in a very narrow band of interest back to port 2 of the fiber optic circulator 44.

Figure 3A:
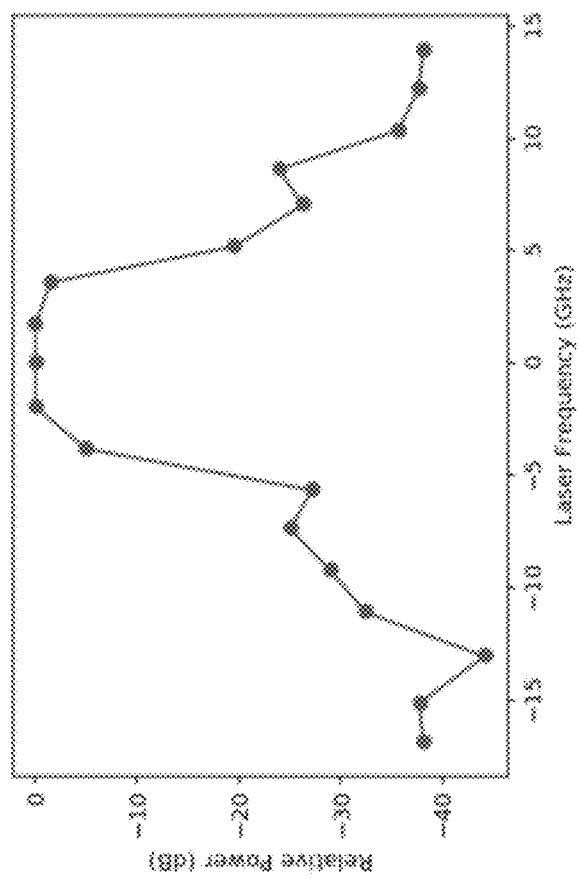
FIGS. 3A and 3B are graphs of illustrative fiber Bragg grating filter reflection.
Figure 3B:
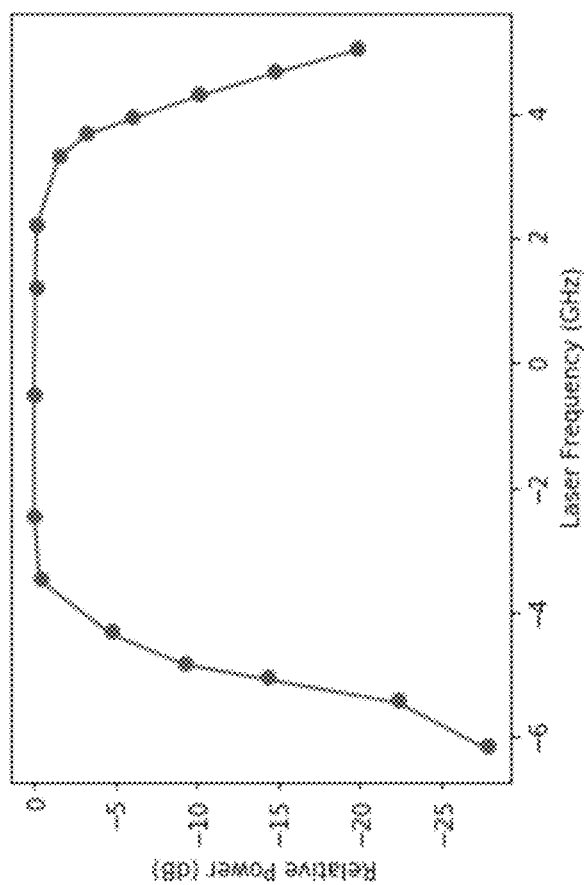

Referring additionally to FIGS. 3A and 3B, graphs of reflection spectra of illustrative fiber Bragg grating filters illustrate reflection bandwidth and sidelobe suppression. In various embodiments, the 3 dB bandwidth of the fiber Bragg grating filter 24 is 6 GHz—which is broad enough to allow greater than 3 GHz tuning range while providing greater than 30 dB suppression of unwanted sidebands of the input optical spectrum. As shown in FIGS. 3A and 3B, in various embodiments sideband suppression is around 15-20 dB at 3-6 GHz from center, around 30 dB at 6-12 GHz from center, and around 40 dB at more than 12 GHz from center.

In various embodiments, light that is incident on port 2 of the fiber optic circulator 44 is directed to port 3 of the fiber optic circulator 44. Back-coupling into port 1 is suppressed by greater than 30 dB by the fiber optic circulator 44. Any residual back-reflection into the laser 12 is further suppressed by around 50 dB by an integrated isolator in the beam splitter 14.

In some embodiments the fiber Bragg grating filter 24 can be a thermally tunable device. In some other embodiments the fiber Bragg grating filter 24 can be an athermal device with a set center wavelength. It will be appreciated that in various embodiments the fiber Bragg grating filter 24 can be used in reflection or transmission as desired for a particular application. It will be appreciated that reflection may be more desirable than transmission in some applications because reflection has a lower optical insertion loss than does transmission.

In general the frequency of the modulator 20 and the bandwidth of the fiber Bragg grating filter 24 may be chosen such that, without limitation: (1) bandwidth of the fiber Bragg grating filter 24 is wide enough to allow an amount of desired frequency agility for a desired application; and (2) frequency of the modulator 20 is chosen so that it is larger than the bandwidth of the fiber Bragg grating filter 24 to help contribute to ensuring that any unwanted carrier signal and any unwanted sideband signals are filtered by a sufficient amount for a given application (which may be, but need not be, typically greater than 20 dB).

It will be appreciated that, once the optical spectrum is filtered by the fiber Bragg grating filter 24, the output of the fiber optic circulator 44 at port 3 is effectively a new, clean, single-tone carrier frequency offset from output of the 1560 nm laser 12 by the RF drive frequency of the RF drive 42. This light goes through an additional 1560 nm modulator 46, which is used at certain points in the instrument cycle to produce sidebands that are used in various applications. Given by way of non-limiting example, in some embodiments during laser cooling a small sideband at around 6.5 GHz is used to depump the lower ground state that inadvertently gets populated. Given by way of another non-limiting example, in some other embodiments in which Raman transitions are desired a sideband at around 6.8 GHz is used to connect the upper and lower ground states. It will be appreciated that the wavelengths and frequencies discussed above are for embodiments that use $^{87}$Rb.

It will be appreciated that the RF drive frequencies and the bandwidth of the fiber Bragg grating filter 24 are only representative and can be adjusted and tailored to specific applications that may entail more tuning range or less tuning range. It will also be appreciated that, in embodiments that entail Raman pulses, different sidebands can be used to allow operation with red detuning or blue detuning for the Raman pulses.

In various embodiments, output of the modulator 46 is directed into an amplifier 48 (such as, without limitation, an erbium doped fiber amplifier (EDFA)) via a fiber optic tap monitor 50 that samples a small portion of the light in the fiber going in the forward direction using an integrated photodetector. The tap monitor 50 taps out a small fraction of the laser power for monitoring power/frequency. In various embodiments, the amplifier 48 amplifies the input signal by on the order of around 1,000 times. For example, in some embodiments the amplifier 48 may amplify the input signal from around 1 mW input to up to around 1 W, depending on the desired output level for a particular application.

In normal operation, the photodetector signal from the tap monitor 50 is provided to a control and processing unit 52 and is used in an interlock circuit for the amplifier 48. In such embodiments, the amplifier 48 is disabled if optical power in the input fiber falls below a pre-set threshold. This safety interlock can help protect the amplifier 48 against damage due to input signal loss. Also, as discussed below regarding operation, the photodetector signal from the tap monitor 50 can be used at initial start-up to coarsely determine frequency of the laser 12.

In various embodiments, amplified light output from the amplifier 48 is provided to the optical frequency doubler 28 (briefly mentioned above). The optical frequency doubler 28 doubles the frequency of the light output from the amplifier 48 (such as, without limitation, from 1560 nm to 780 nm). In various embodiments, the optical frequency doubler 28 can provide greater than 600 mW of output power for 1 W input.

In various embodiments, light output from the optical frequency doubler 28 is provided to a variable optical attenuator 54. The variable optical attenuator 54 is a fiber coupled device that uses a micro-electromechanical (MEMs) mirror to control the optical power in the output fiber, such as by attenuating power to a user-defined level. The variable optical attenuator 54 is used to stabilize the input optical power into the remainder of the 780 nm free-space optical assembly and opto-electronics (not shown). In various embodiments the variable optical attenuator 54 can be used as a part of a closed-loop intensity control with a monitor photodetector located in the free-space optical assembly and opto-electronics (not shown). It will be appreciated that the free space optical assembly and opto-electronics is application specific and details of its construction and operation is not required for an understanding of disclosed subject matter.

In various embodiments the control and processing unit 52 is electrically connected to receive various control inputs and is electrically connected to various components to provide control signals. Given by way of non-limiting example, the control and processing unit 52 may receive the photodetector signal from the tap monitor 50 as described above. In various embodiments, the control and processing unit 52 may be electrically coupled to the optical assembly and opto-electronics (not shown) to receive control signals therefrom (such as, without limitation, a power monitor photodetector, an atom fluorescence/absorption photodetector, or the like). In various embodiments, the control and processing unit 52 may be electrically coupled to various components of the system 10 to provide control signals thereto. Given by way of non-limiting examples, the control and processing unit 52 may be electrically coupled to provide control signals to: the laser 12 (at startup); the fiber Bragg grating filter 24; the optical frequency doublers 28 and 30 and the saturation absorption spectrometer 38 (to command temperature controllers at startup); the RF drives 34, 36, and 42; the RF drive for the modulator 46; the amplifier 48 (that is, the safety interlock signal); the variable optical attenuator 54; and to various components of the optical assembly and opto-electronics (not shown). It will be appreciated that the control and processing unit 52 may be any suitable computer controller and/or computer processor as desired that is suitable for controlling components of the system 10 and the optical assembly and opto-electronics (not shown).

Regarding fabrication, various disclosed embodiments are based on polarization-maintaining fiber-optic components that are fiber-spliced to each other to create a continuous chain that is spooled onto a spool plate. Such fabrication implementations can help provide a rugged laser system that avoids optical alignment by the user and that can operate through temperature and humidity variations in the environment. In various embodiments, the spool plate, including most of the control electronics can be thermally stabilized, if desired. However, it will be appreciated that any fabrication techniques suitable for laser systems may be used as desired for a particular application.

Various embodiments operate as follows. It will be appreciated that, in general, the lock circuit 26 is configured to determine and stabilize wavelength of the laser 12 and is further configured to cooperate with the fiber Bragg grating filter 24 to maintain a static lock point for the laser 12 while allowing the output of the path 16 to be tunable with respect to the lock point. In various embodiments the modulator 20 creates sidebands and the laser sideband is locked to the atomic transition (which means the output of the laser 12 is offset from the desired frequency by that offset). Then the modulator 20 and the fiber Bragg grating filter 24 are used to tune the path 16 with respect to the lock point and bring it back to the desired frequency. This cooperation between the lock circuit 26 and the fiber Bragg grating filter 24 results, in part, from the ability to engineer the ultra-narrow band frequency selectivity and the "tophat-like" frequency roll-off characteristic of the fiber Bragg grating filter 24. That is, as the RF drive 42 sweeps the modulator 20 across various frequencies/wavelengths, the steep, nearly vertical frequency roll-off characteristic of the fiber Bragg grating filter 24 permits greater than 20 dB (that is, greater than 100 times) suppression of the unwanted frequency components while providing several GHz tuning range in the path 16. In contrast, transfer function of other filter types, such as Fabry Perot filters, are constrained and lead to trade-offs between good suppression of unwanted sidebands and wide-band tunability of the main output, thereby making them a poor choice for this laser stabilization architecture.

Given by way of non-limiting example by way of illustration only, in various embodiments light is doubled from 1560 nm to 780 nm. Accordingly, frequency of the modulator drive in the lock path 18 is roughly twice the frequency of the modulator drive in the main path 16 because when frequency is doubled the detuning doubles. It will be appreciated that frequency doubling is approximate because the main path 16 is tunable and, therefore, doubling is is not exactly twice as much but is close.

Now that cooperation of the lock circuit 26 and the fiber Bragg grating filter 24 has been explained by way of illustration and not of limitation, overall operation will be discussed. At start-up, the laser 12 is turned on with preset current and temperature settings. Likewise, the RF drives 34, 36, and 42 are turned on. In embodiments in which the fiber Bragg grating filter 24 is a tunable grating, temperature of the fiber Bragg grating filter 24 is set to the desired temperature. It will be appreciated that the fiber Bragg grating filter 24 can also be an athermal design in which the center wavelength is pre-set and no active control is entailed by the user. Next the optical frequency doublers 28 and 30 are set to pre-determined temperatures for efficient doubling at the desired wavelength. To get the laser 12 to the correct wavelength, the photodetector signal from the tap monitor 50 can be utilized. It will be appreciated that, in various embodiments, the photodetector signal from the tap monitor 50 goes above a setpoint threshold only if the frequency of the laser 12 is within 6 GHz of the desired setting. This can be accomplished by sweeping the frequency of the laser 12 using a ramp signal generated by the servo electronics. In this manner, the fiber Bragg grating filter 24 can act as a built-in absolute optical wavelength meter with 6 GHz resolution that allows a user to quickly acquire the desired laser frequency without resorting to a saturated absorption atomic spectroscopy signal—which produces a much more complicated waveform than does the tap monitor 50. With the wavelength being coarsely identified, the saturated absorption features can be used to further refine the lock point and stabilize the laser 12. Once the laser 12 is stabilized and sufficient optical power is incident on input to the amplifier 48, the amplifier 48 can be turned on to the desired current value and the optical output power at 780 nm can be monitored with a downstream photodetector to optimize parameters of the amplifier 48 and the optical frequency doubler 28.

After initial startup, in various embodiments frequency of the laser 12 is tuned to desired rubidium transitions using the RF drive 42, and specific, desired sidebands can be introduced with the RF drive that drives the modulator 46. Timing of the requisite RF frequency transitions are provided by the control and processing unit 52.

Finally, any imperfections in the RF drive 42 or in the reflection spectrum of the fiber Bragg grating filter 24 might lead to small discrete jumps in the optical power level at the input to the amplifier 48—which can translate into small optical power fluctuations that can take more than 100 microseconds or so to settle to final values. Once again, the tap monitor 50 can be used to identify these small variations in order to generate a look-up table in the control and processing unit 52 to adjust level and frequency of the RF drive 42 to reduce optical power fluctuations. This operation suitably can be done once at initial start-up to calibrate the system 10.

Figure 4A:
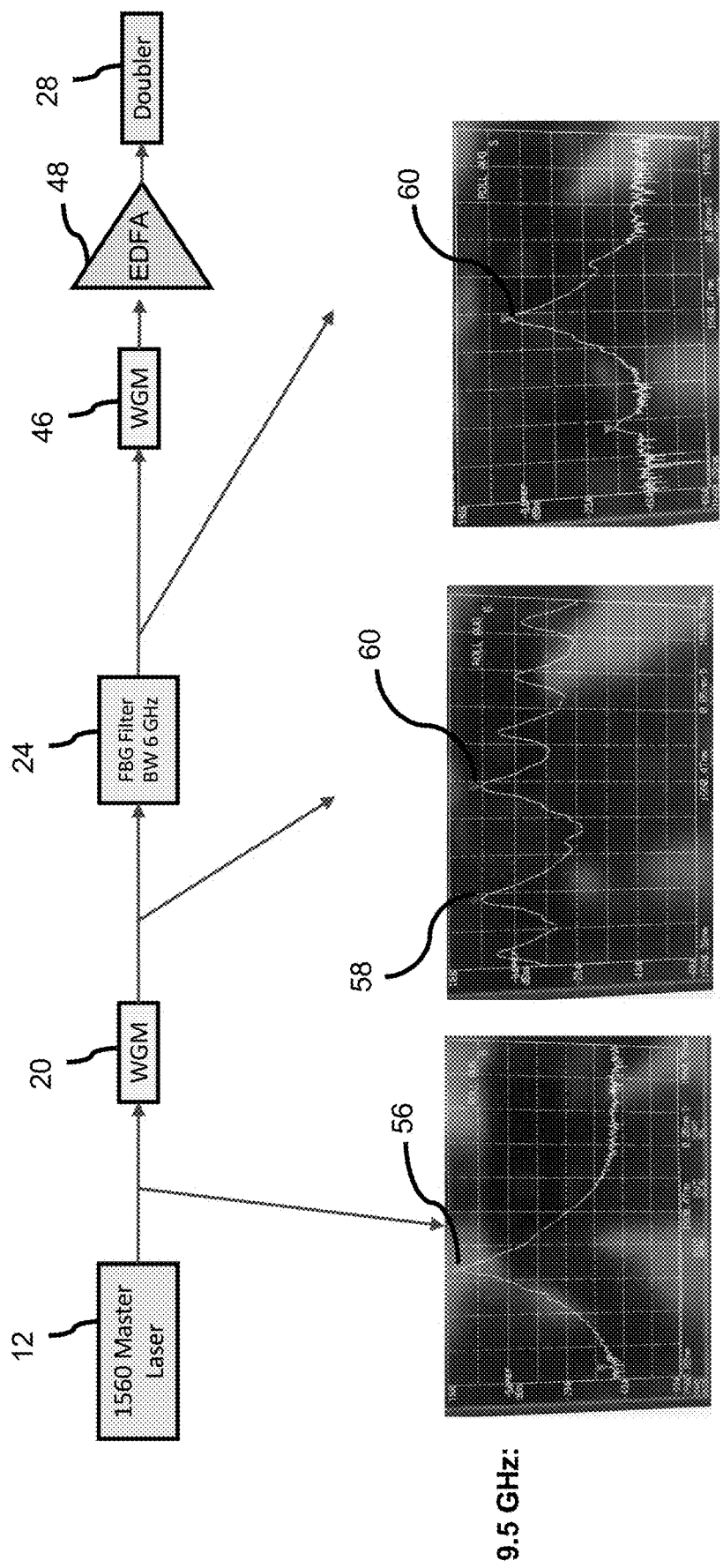
FIGS. 4A and 4B illustrate frequency spectra at various nodes in the system of FIG. 1.
Figure 4B:
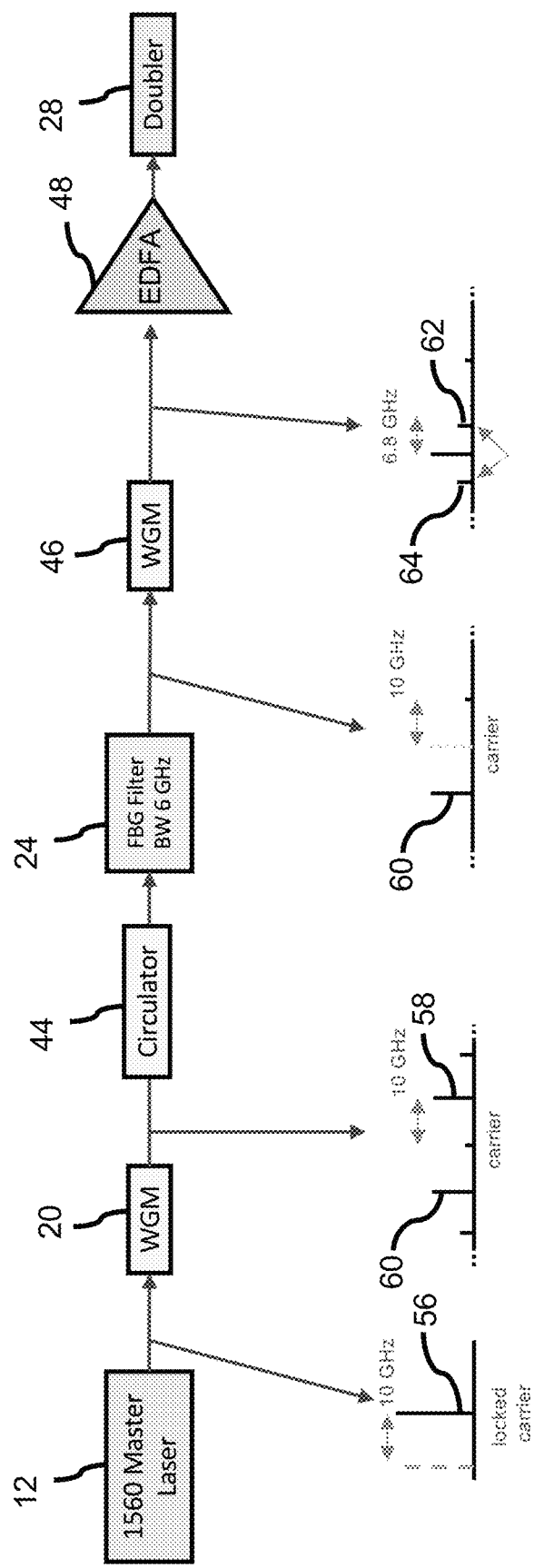

Referring additionally to FIGS. 4A and 4B, in various embodiments after startup optical spectrum of output of the laser 12 is shown to represent a locked carrier frequency offset 56 of around 10 GHz. A first order upper sideband 58 and a first order lower sideband 60 are introduced as a result of modulation by the modulator 20. In embodiments in which the fiber Bragg grating filter has a bandwidth on the order of around 6 GHz or so, the upper sideband 58 is filtered out and the lower sideband 60 is passed therethrough—and thereby becomes a new carrier frequency at a desired carrier frequency. It will be appreciated that in the optical spectrum analyzer (OSA) traces shown in FIG. 4A, the x-axis of the OSA traces is wavelength and not frequency. As a result, a sideband that is lower in frequency is a sideband that is higher in wavelength. Thus, the lower sideband 60 appears to the right of the upper sideband 58 in the middle OSA trace of FIG. 4B. In various embodiments, additional modulation by the modulator 46 may provide additional upper and lower sidebands 62 and 64 to encode information as desired for various applications, such as, without limitation, Raman transitions, re-pumping, and optical pumping.

It will be appreciated that various additional embodiments may be provided as desired for specific applications.

For example and referring additionally to FIGS. 5A and 5B, in some embodiments only the shifted carrier 60 (FIG. 4B) and first order upper sidebands 62 (FIG. 4B) are used by the free-space optical assembly and opto-electronics. Given by way of non-limiting examples, such applications may entail repumping/optical pumping and/or Raman pulses. For repumping/optical pumping, the upper sideband 62 is at approximately 6.5 GHz and for Raman pulses the upper sideband 62 is at approximately 6.8 GHz.

It will be appreciated the modulator 46 is a convenient way to generate the upper sideband 62. However, as a simple phase modulator, the modulator 46 generates a multitude of sidebands—that is, upper and lower sidebands at harmonics of RF frequency of the RF drive that drives the modulator 46.

It will be appreciated that these spurious sidebands (spurs) can be detrimental and, as a result, it is desirable to eliminate them. First, they reduce efficiency of the system 10 and its driven instrument because, without any additional filtering, the unwanted spurs are amplified and frequency doubled along with the desired tones. For example, during Raman transitions, around one third of the optical power resides in these unwanted spurs. Second, these spurious sidebands can lead to various systematic errors, such as AC Stark shifts and unwanted interferometer paths, that can be detrimental to accuracy of the instrument driven by the system 10 and can lead to baseline drifts. These systemic errors can limit accuracy of sensors to several orders magnitude higher than the fundamental precision of the device.

FIGS. 5A and 5B depict two ways that an additional fiber Bragg grating filter can be used to filter out unwanted spurs. In either case, the bandwidth of the filter is around 10 GHz (that is, sufficiently large to reflect the carrier and first order upper sideband and reject all other harmonics). Each of these approaches entails use of an additional fiber Bragg grating filter in the path 16.

As shown in FIG. 5A, in some embodiments another bandpass filter circuit 22A is provided at 1560 nm right after the modulator 46 and before the tap monitor 50 to filter before amplification. The bandpass filter circuit 22A includes a fiber optic circulator 44A and a fiber Bragg grating filter 24A. As mentioned above, the bandwidth of the fiber Bragg grating filter 24A is around 10 GHz. Except for bandwidth of the fiber Bragg grating filter 24A, all other details regarding the fiber optic circulator 44A and the fiber Bragg grating filter 24A are the same as for the fiber optic circulator 44 and the fiber Bragg grating filter 24 and need not be repeated for an understanding of disclosed subject matter. It will be appreciated that the filtering approach shown in FIG. 5A is desirable because it filters the components before amplification. This means that almost all output from the amplifier 48 will go to generating the proper sidebands—which can lead to about a thirty percent increase in useful power output.

As shown in FIG. 5B, in some other embodiments a fiber Bragg grating filter 24B is provided at 780 nm after the optical frequency doubler 28 to filter after frequency doubling. Except for bandwidth of the fiber Bragg grating filter 24B, all other details regarding the fiber Bragg grating filter 24B are the same as for the fiber Bragg grating filter 24 and need not be repeated for an understanding of disclosed subject matter.

It will be appreciated that spectrum obtained in the approach of FIG. 5A may not be not as clean as what is achievable with a filter directly at 780 nm (that is, the approach of FIG. 5B) because frequency doubling of two tones simultaneously leads to extra doubling products. Specifically, it leads to a spur at the second sideband of the modulation. However, at the nominal power ratios entailed between the carrier 60 and the first order upper sideband 62 (where the sideband 62 has roughly half the optical power as the carrier 60 for a red-detuned Raman transition), this spur is at a few percent level. This level is comparable to, or smaller than, the power that would be at this frequency without a fiber Bragg grating filter filtering the spectrum. All other tones, including the prominent red-detuned sidebands, are suppressed by at least 25-30 dB, depending on the exact parameters of the fiber Bragg grating filter 24B.

It will be appreciated that the reflection/transmission spectrum of the fiber Bragg grating filters 24A and 24B can be engineered with much higher precision and control to create flat top-hat like spectra that can have extremely fast roll off outside the bandwidth of the filter. It will be further appreciated that realizing such spectra with a Fabry Perot filter is extremely challenging. For example, a cavity mode with sufficiently low Q resonance to transmit both the carrier 60 and the sideband 62 would have very little filtering at the first order lower sideband 64 (FIG. 4B).

It will be appreciated that even more embodiments are contemplated. For example, various disclosed embodiments use components that are all polarization-maintaining fiber-coupled devices that can be spliced together for robust, alignment-free operation. However, in general the same filtering scheme can be used with free space components or a combination of fiberized and free-space components.

In other cases, it will be appreciated that changes such as placing the modulator 46 after the amplifier 48 or after the optical frequency doubler 28 would be similar in performance—depending on power handling and component losses available.

In various embodiments, if desired, the 780 nm modulator 32 in the path 18 can be eliminated by moving the modulator 32 to 1560 nm before the optical frequency doubler 30 in the path 18. It will be appreciated that such embodiments can help provide advantages such as use of modulators at 1560 nm—which are more robust, cheaper, and readily available than are modulators at 780 nm. It will also be appreciated that such embodiments can be subject to optical power incident on the optical frequency doubler 30 being reduced by roughly half due to insertion loss through the modulator 32. As a result, generated optical power at 780 nm may be reduced by around four times. It will be appreciated that the trade-off might be useful if there is enough optical power.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A laser system comprising:
   a tunable laser;
   a beam splitter operatively couplable to an output of the tunable laser and configured to split light output from the tunable laser into a first path and a second path;
   a first modulator disposed in the first path, the first modulator being configured to generate a first plurality of sidebands;
   a bandpass filter circuit operatively couplable to receive output from the first modulator and to pass a selected one of the first plurality of sidebands therethrough, the bandpass filter circuit including a fiber Bragg grating filter; and
   a lock circuit disposed in the second path, the lock circuit being configured to determine and stabilize a wavelength of the tunable laser, the lock circuit being further configured to cooperate with the fiber Bragg grating filter to maintain a static lock point for the tunable laser while allowing output of the first path to be tunable with respect to the lock point.

2. The laser system of claim 1, wherein the tunable laser is configured to operate at a wavelength of 1,560 nm.

3. The laser system of claim 1, wherein the tunable laser includes a laser chosen from a distributed feedback laser, an extended cavity diode laser, and a fiber laser.

4. The laser system of claim 1, further comprising a first radio frequency synthesizer configured to provide a first radio frequency drive signal to the first modulator.

5. The laser system of claim 1, wherein the first modulator includes an electro-optic phase modulator.

6. The laser system of claim 5, wherein the first modulator includes a lithium niobate waveguide device.

7. The laser system of claim 1, wherein the bandpass filter circuit further includes a fiber optic circulator.

8. The laser system of claim 7, wherein:
   the output from the first modulator is coupled from a first port of the fiber optic circulator to a second port of the fiber optic coupler;
   the second port of the fiber optic coupler is coupled to the fiber Bragg grating filter; and
   light incident on the second port from the fiber Bragg grating filter is coupled to a third port of the fiber optic coupler.

9. The laser system of claim 1, further comprising a second modulator operatively coupled to receive light output from the bandpass filter circuit and to generate a second plurality of sidebands.

10. The laser system of claim 1, further comprising an optical frequency doubler configured to double frequency of light in the first path.

11. A laser system comprising:
    a tunable laser;
    a beam splitter operatively couplable to an output of the tunable laser and configured to split light output from the tunable laser into a first path and a second path;
    a first modulator disposed in the first path, the first modulator being configured to generate a first plurality of sidebands;
    a bandpass filter circuit operatively couplable to receive output from the first modulator and to pass a selected one of the first plurality of sidebands therethrough, the bandpass filter circuit including a fiber Bragg grating filter and a fiber optic circulator operatively coupled to each other;
    a second modulator operatively coupled to receive light output from the bandpass filter circuit and to generate a second plurality of sidebands;
    an optical frequency doubler configured to double frequency of light in the first path; and
    a lock circuit disposed in the second path, the lock circuit being configured to determine and stabilize a wavelength of the tunable laser, the lock circuit being further configured to cooperate with the fiber Bragg grating filter to maintain a static lock point for the tunable laser while allowing output of the first path to be tunable with respect to the lock point.

12. The laser system of claim 11, wherein the tunable laser is configured to operate at a wavelength of 1,560 nm.

13. The laser system of claim 11, wherein the tunable laser includes a laser chosen from a distributed feedback laser, an extended cavity diode laser, and a fiber laser.

14. The laser system of claim 11, further comprising a first radio frequency synthesizer configured to provide a first radio frequency drive signal to the first modulator.

15. The laser system of claim 11, wherein the first modulator includes an electro-optic phase modulator.

16. The laser system of claim 15, wherein the first modulator includes a lithium niobate waveguide device.

17. The laser system of claim 11, wherein:
the output from the first modulator is coupled from a first port of the fiber optic circulator to a second port of the fiber optic coupler;
the second port of the fiber optic coupler is coupled to the fiber Bragg grating filter; and
light incident on the second port from the fiber Bragg grating filter is coupled to a third port of the fiber optic coupler.

18. A laser system comprising:
a tunable laser;
a beam splitter operatively couplable to an output of the tunable laser and configured to split light output from the tunable laser into a first path and a second path;
a first modulator disposed in the first path, the first modulator being configured to generate a first plurality of sidebands;
a first bandpass filter circuit operatively couplable to receive output from the first modulator and to pass a selected one of the first plurality of sidebands therethrough, the first bandpass filter circuit including a first fiber Bragg grating filter;
a second modulator operatively coupled to receive light output from the first bandpass filter circuit and to generate a second plurality of sidebands;
a second bandpass filter circuit operatively couplable to receive light modulated by the second modulator and to pass a selected one of the second plurality of sidebands therethrough, the second bandpass filter circuit including a second fiber Bragg grating filter; and
a lock circuit disposed in the second path, the lock circuit being configured to determine and stabilize a wavelength of the tunable laser, the lock circuit being further configured to cooperate with the first fiber Bragg grating filter to maintain a static lock point for the tunable laser while allowing the output of the first path to be tunable with respect to the lock point.

19. The laser system of claim 18, wherein the tunable laser is configured to operate at a wavelength of 1,560 nm.

20. The laser system of claim 18, wherein the tunable laser includes a laser chosen from a distributed feedback laser, an extended cavity diode laser, and a fiber laser.

21. The laser system of claim 18, further comprising a first radio frequency synthesizer configured to provide a first radio frequency drive signal to the first modulator.

22. The laser system of claim 18, wherein the first modulator includes an electro-optic phase modulator.

23. The laser system of claim 22, wherein the first modulator includes a lithium niobate waveguide device.

24. The laser system of claim 18, wherein the first and second bandpass filter circuits further include first and second fiber optic circulators, respectively.

25. The laser system of claim 24, wherein:
outputs from the first and second modulators are coupled from a first port of the first and second fiber optic circulators, respectively, to a second port of the first and second fiber optic couplers;
the second port of the first and second fiber optic couplers is coupled to the first and second fiber Bragg grating filters, respectively; and
light incident on the second port from the first and second fiber Bragg grating filters is coupled to a third port of the first and second fiber optic couplers, respectively.

26. The laser system of claim 18, further comprising an optical frequency doubler configured to double frequency of light in the first path.

* * * * *